(12) United States Patent
Chen et al.

(10) Patent No.: US 11,099,613 B1
(45) Date of Patent: Aug. 24, 2021

(54) FLOATING INTERPOSER

(71) Applicant: Dell Products, L.P., Round Rock, TX (US)

(72) Inventors: Yuxin Chen, Shanghai (CN); Sandburg Hu, Shanghai (CN); Xiang Yu, Shanghai (CN); Qingqiang Guo, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/925,791

(22) Filed: Jul. 10, 2020

(30) Foreign Application Priority Data

Jun. 24, 2020 (CN) .......................... 202010586673.5

(51) Int. Cl.
*G06F 1/18* (2006.01)
(52) U.S. Cl.
CPC ............. *G06F 1/181* (2013.01); *G06F 1/183* (2013.01)
(58) Field of Classification Search
CPC ...................................... H05K 5/00
See application file for complete search history.

(56) References Cited

U.S. PATENT DOCUMENTS

2011/0228473 A1* 9/2011 Anderson ................ H04Q 1/08
361/679.58

* cited by examiner

*Primary Examiner* — Jerry Wu
(74) *Attorney, Agent, or Firm* — Fogarty LLP

(57) ABSTRACT

The front of a rack-mounted 2RU (Rack Unit) chassis includes bays that receive replaceable components, such as storage drives. Two rear slots of such chassis may each receive 1RU servers that couple to a chassis midplane via interposers. Administration of such 2RU chassis is simplified when a 1 RU server can be installed identically in the top or bottom chassis slot. Embodiments provide this capability while avoiding locating interposers along the center of the midplane. A lower guide routes a floating interposer of the server to lower midplane connectors as the server is inserted in the lower slot. An upper guide routes the floating interposer to upper midplane connectors as the server is inserted in the upper slot. The floating interposer moves up and down based vertical travel of guidewheels that protrude from the server and are routed by the guides as the server is inserted in a slot.

14 Claims, 7 Drawing Sheets ns # FLOATING INTERPOSER

FIELD

This disclosure relates generally to Information Handling Systems (IHSs), and more specifically, to connections utilized by IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers that are installed within chassis and stacked within slots provided by racks. A data center may include large numbers of such racks that may be organized into rows in a manner that allows administrators to access IHS components via the front and back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis of an IHS. In other instances, administrators may remove an IHS from operation in order to service or replace some of its internal components. In all such cases, it is preferable that administrators be able to access and administer an IHS as easily and safely as possible within the constraints of a server IHS being installed within a rack of a densely packed data center.

In many instances, rack systems are constructed using standardized dimensions that define vertical and horizontal dimensions for components, such as server IHSs, that are installed within such racks. Standardized rack dimensions specify vertical units of space within a rack, where such vertical units of rack space are commonly referred to as RUs (Rack Units). In some instances, a chassis may be one rack unit (1RU) in height and may house a single IHS. In other instances, a chassis be multiple rack units in height and the chassis may include multiple IHSs. For example, a 2 RU chassis may include a set of front bays that receive replaceable storage drives and may house two server IHSs that are each 1RU in height. In such instances, each of the 1RU IHSs may be separately administered and may themselves be replaceable components that may be coupled and de-coupled from a chassis.

SUMMARY

In various embodiments, chassis house a first Information Handling System (IHS). The chassis embodiment include: a lower slot comprising a plurality of lower connectors for receiving a floating interposer of the first IHS; a lower guide that routes the floating interposer of the first IHS to the lower connectors as the first IHS is inserted in the lower slot; an upper slot comprising a plurality of upper connectors for receiving the floating interposer of the first IHS; and an upper guide that routes the floating interposer of the first IHS to the upper connectors as the first IHS is inserted in the upper slot.

In additional chassis embodiments, the lower connectors and upper connectors couple the floating interposer of the first IHS to a midplane of the chassis. In additional chassis embodiments, the midplane comprises connectors for coupling a plurality of storage devices to the chassis. In additional chassis embodiments, the lower guide comprises a rail that routes a guidewheel of the floating interposer to a vertical location of the lower connectors of the chassis as the first IHS is inserted in the lower slot. In additional chassis embodiments, the upper guide comprises a rail that routes the guidewheel of the floating interposer to a vertical location of the upper connectors of the chassis as the first IHS is inserted in the upper slot. In additional chassis embodiments, the floating interposer is raised along a plurality of guideposts by the routing of the guide wheel by the rail of the upper guide. In additional chassis embodiments, the lower guide comprises a channel that receives the guidewheel and aligns the floating interposer with the lower connectors. In additional chassis embodiments, the upper guide comprises a channel that receives the guidewheel and aligns the floating interposer with the upper connectors.

In various additional embodiments, Information Handling Systems (IHSs) include: one or more processors and a memory device coupled to the one or more processors; and a floating interposer for coupling the IHS to a chassis, wherein a vertical position of the floating interposer is aligned with a plurality of lower connectors of the chassis when the IHS is inserted in the lower slot of the chassis and wherein the wherein the vertical position of the floating interposer is aligned with a plurality of upper connectors of the chassis when the IHS is inserted in the upper slot of the chassis.

In additional IHS embodiments, the floating interposer comprises a plurality of connectors received by the upper and lower connectors of the chassis. In additional IHS embodiments, the upper and lower connectors are located on a midplane of the chassis. In additional IHS embodiments, the midplane comprises connectors for coupling a plurality of storage devices to the chassis. In additional IHS embodiments, the floating interposer comprises a plurality of guidewheels that protrude from an enclosure of the IHS. In additional IHS embodiments, the plurality of protruding guidewheels are received by rails comprised within the upper and lower slots of the chassis. In additional IHS embodiments, vertical movement of the guidewheels moves the floating interposer vertically. In additional embodiments, IHSs further include a plurality of guideposts that extend from the base of an enclosure of the IHS and limit movement of the floating interposer along a vertical axis.

In various additional embodiments, methods are provided for modifying information processing capabilities provided by a chassis capable of hosting a plurality of IHSs (Information Handling Systems). The methods include: inserting a first IHS within a lower slot of the chassis, wherein the insertion of the first IHS in the lower slot aligns a floating interposer of the first IHS with a plurality of lower connectors of a midplane of the chassis; and inserting the first IHS within an upper slot of the chassis, wherein the insertion of the first IHS in the upper slot aligns the floating interposer of the first IHS with a plurality of upper connectors of the midplane of the chassis.

In additional method embodiments, the floating interposer is aligned with the plurality of lower connectors by a plurality of guides along sidewalls of the chassis within the lower slot. In additional method embodiments, the floating interposer is aligned with the plurality of upper connectors by a plurality of guides along sidewalls of the chassis within the upper slot. In additional method embodiments, the floating interposer is guided vertically along a set of guideposts of the first IHS when inserted in the upper slot and when inserted in the lower slot.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
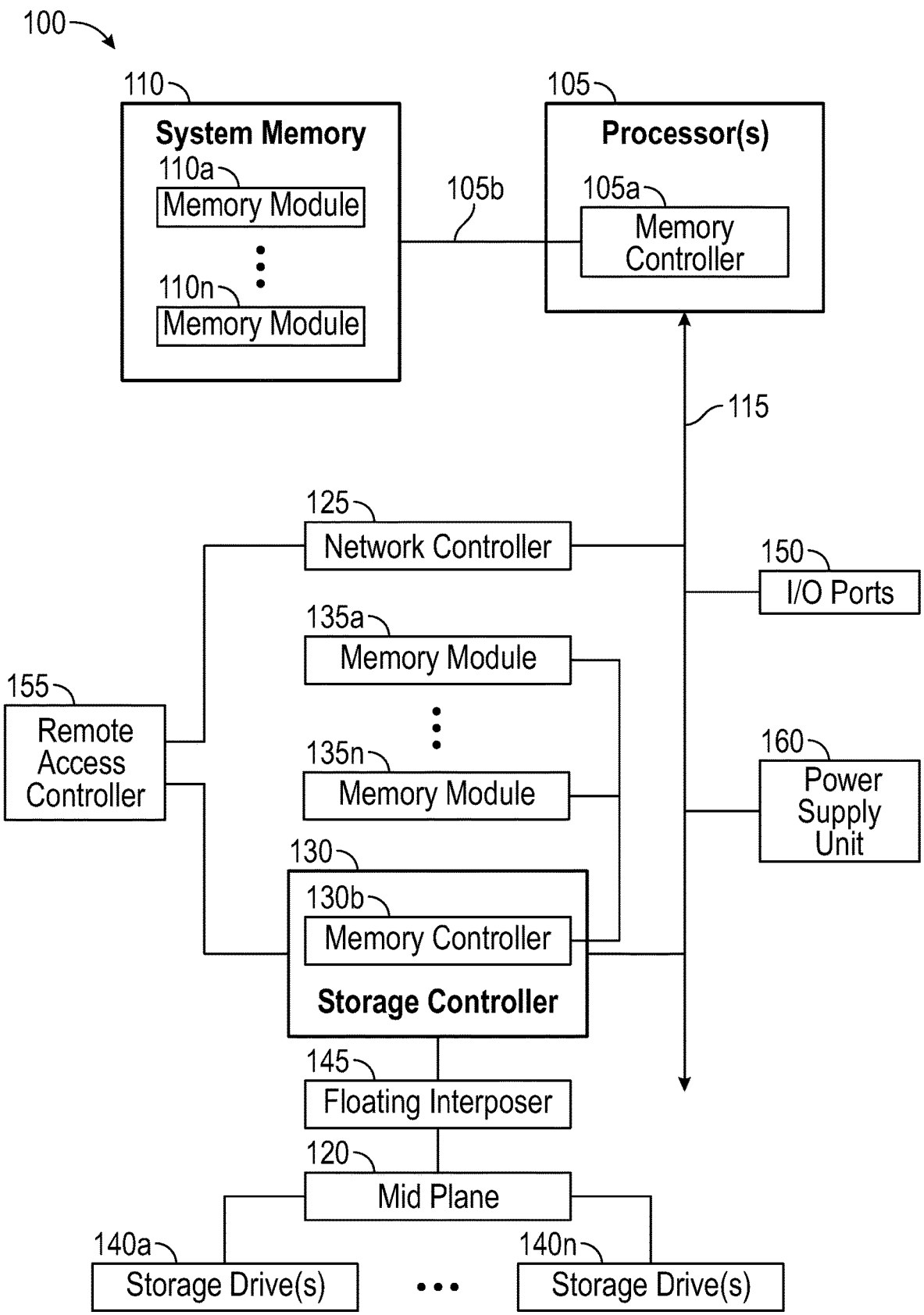
FIG. 1 is a diagram illustrating certain components of an IHS configured, according to embodiments, for use with a floating interposer.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of enterprise computing servers, other embodiments may be utilized.

As described, in a data center environment, a server IHS may be installed within a chassis, in some cases along with other similar server IHSs. A rack may house multiple such chassis and a data center may house numerous racks. Each rack may host a large number of IHSs that are installed as components of a chassis and multiple chassis are stacked and installed within racks. In certain instances, the front-side of such rack-mounted chassis may include one or more bays that each receive an individual replaceable component, such as a storage drive. Some rack-mounted chassis may be multiple rack units in height and may house multiple IHSs. For example, a 2RU chassis may house two 1RU server IHSs. In such instances, the individual 1RU sever IHSs may be replaceable components of the 2RU chassis, with one 1RU server installed in a lower slot of the chassis and the second 1RU server installed in an upper slot of the chassis. A 1RU sever may be extracted from its slot via the rear of such a 2RU chassis and replaced with a different 1RU server that is also compatible with the slots of a 2RU chassis. Administration of such chassis is simplified when such 1 RU servers may be installed in either the top or bottom slot of the 2RU chassis. However, as described in additional detail below, providing support for the same 1RU server within upper and lower slots of a 2RU chassis is complicated by constraints on the space available for mating a 1RU server to a midplane of a 2RU chassis.

FIG. 1 illustrates components of an IHS 100 configured according to various embodiments to implement systems and methods described herein for use of a floating interposer by which IHS 100 may be coupled to a chassis. Although the embodiments provided herein describe an IHS that is a rack-mounted server, other embodiments may be implemented using other types of IHSs. In the illustrative embodiment of FIG. 1, IHS 100 may be a server that would typically be installed within a chassis, that in turn would be typically installed within slots of a rack. Installed in this manner, IHS 100 may utilize certain shared resources provided by the chassis and/or rack, such as power and networking. In some embodiments, multiple servers such as IHS 100 may be installed within a single chassis. For instance, IHS 100 may be a 1RU server that is paired with a similar 1RU component, such as another server similar to IHS 100, and installed with a 2RU chassis.

IHS 100 may include one or more processors 105. In some embodiments, processors 205 may include a main processor and a co-processor, each of which may include a plurality of processing cores. As illustrated, processor(s) 105 may include an integrated memory controller 105a that may be implemented directly within the circuitry of the processor 105, or the memory controller 105a may be a separate integrated circuit that is located on the same die as the processor 105. The memory controller 105a may be configured to manage the transfer of data to and from the system memory 110 of the IHS 105 via a high-speed memory interface 105b.

System memory 110 may include memory components, such as such as static RAM (SRAM), dynamic RAM (DRAM), NAND Flash memory, suitable for supporting high-speed memory operations by the processor(s) 105. System memory 110 may combine both persistent, non-volatile memory and volatile memory. In certain embodiments, the system memory 110 may be comprised of multiple removable memory modules. The system memory 110 of the illustrated embodiment includes removable memory modules 110a-n. Each of the removable memory modules 110a-n may utilize a form factor corresponding to a motherboard expansion card socket that receives a type of removable memory module 110a-n, such as a DIMM (Dual In-line Memory Module). Other embodiments of IHS system memory 110 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 100 may operate using a chipset that may be implemented by integrated circuits that couple processor 105 to various other components of the motherboard of IHS 100. In some embodiments, all or portions of the chipset may be implemented directly within the integrated circuitry of an individual processor 105. The chipset may provide the processor(s) 105 with access to a variety of resources accessible via one or more buses 115. Various embodiments may utilize any number of buses to provide the illustrated pathways provided by the single illustrated bus 115. In certain embodiments, bus 115 may include a PCIe (PCI Express) switch fabric that is accessed via a root complex and coupled processor 105 to a variety of internal and external PCIe devices.

In various embodiments, a variety of resources may be coupled to the processor(s) 105 of the IHS 100 via buses 115 managed by the processor chipset. In some cases, these resources may be components of the motherboard of IHS 100 or these resources may be resources coupled to IHS 100, such as via I/O ports 150. In some embodiments, IHS 100 may include one or more I/O ports 150, such as PCIe ports, that may be used to couple the IHS 100 directly to other IHSs, storage resources or other peripheral components. In certain embodiments, the I/O ports 150 may provide couplings to a backplane or midplane of the chassis in which the IHS 100 is installed. In some instances, I/O ports 150 may include rear-facing externally accessible connectors by which external systems and networks may be coupled to IHS 100. As described in additional detail below, data center administration is complicated by non-uniform rack installations that confuse the ability to accurately identify specific external rear-facing I/O ports.

As illustrated, IHS 100 may also include a power supply unit 160 that provides the components of the chassis with appropriate levels of DC power. The power supply unit 160 may receive power inputs from an AC power source or from a shared power system that is provided by a rack within which IHS 100 may be installed. In certain embodiments, power supply unit 160 may be implemented as a swappable component that may be used to provide IHS 100 with redundant, hot-swappable power supply capabilities.

As illustrated, processor(s) 105 may also be coupled to a network controller 125, such as provided by a Network Interface Controller (NIC) that is coupled to the IHS 100 and allows the IHS 100 to communicate via an external network, such as the Internet or a LAN. Network controller 125 may include various microcontrollers, switches, adapters, and couplings used to connect IHS 100 to a network, where such connections may be established by IHS 100 directly or via shared networking components and connections provided by a rack in which chassis 100 is installed. In some embodiments, network controller 125 may allow IHS 100 to interface directly with network controllers from other nearby IHSs in support of clustered processing capabilities that utilize resources from multiple IHSs. In some embodiments, network controller 125 may be a swappable component that may be externally accessed and replaced while IHS 100 remains operational, for instance via a rear-facing bay of the IHS. Access to such rear-facing components of IHS 100 may be complicated in a data center environment, especially when installed in a non-uniform manner, such as described below.

IHS 100 may include one or more storage controllers 130 that may be utilized to access storage drives 140a-n that are accessible via the chassis in which IHS 100 is installed. Storage controllers 130 may provide support for RAID (Redundant Array of Independent Disks) configurations of logical and physical storage drives 140a-n. In some embodiments, storage controller 155 may be an HBA (Host Bus Adapter) that provides limited capabilities in accessing physical storage drives 140a-n. In many embodiments, storage drives 140a-n may be replaceable, hot-swappable storage devices that are installed within bays provided by the chassis in which IHS 100 is installed. In some embodiments, storage drives 140a-n may also be accessed by other IHSs that are also installed within the same chassis as IHS 100. For instance, when installed within a 2RU chassis, IHS 100 may be a 1RU component of the chassis that is able to access storage drives 140a-n along with another 1RU IHS that is also installed within a slot of the 2RU chassis. Although a single storage controller 130 is illustrated in FIG. 1, IHS 100 may include multiple storage controllers that may operate similarly to storage controller 130. In embodiments where storage drives 140a-n are hot-swappable devices that are received by bays of chassis, the storage drives 140a-n may be coupled to IHS 100 by couplings the bays of the chassis to a midplane 145 of IHS 100. In various embodiments, storage drives 140a-n may include SAS (Serial Attached SCSI) magnetic disk drives, SATA (Serial Advanced Technology Attachment) magnetic disk drives, solid-state drives (SSDs) and other types of storage drives in various combinations.

As illustrated, storage controller 130 may access storage drives 140a-n via a floating interposer 145 that connects the storage controller 130 to a midplane 120 of the chassis in which IHS 100 is installed. The floating interposer 145 may be connected to storage controller 130, or other internal components of IHS 100, via one or more cables. As described in additional detail with regard to the below embodiments, the cables connecting the floating interposer 145 to the storage controller 130 allow the floating interposer 145 to travel upwards and downwards within a front compartment of an IHS, thus allowing the IHS 100 to be coupled within a lower slot or an upper slot of a 2RU chassis. Utilizing this capability, the floating interposer 145 may be coupled to upper connectors or lower connectors of a midplane 120 of the 2RU chassis in order to couple IHS 100 to the front-facing bays that house storage drives 140a-n.

As with processor(s) 105, storage controller 130 may also include an integrated memory controller 130b that may be used to manage the transfer of data to and from one or more memory modules 135a-n via a high-speed memory interface. Through use of memory operations implemented by memory controller 130b and memory modules 135a-n, storage controller 130 may operate using cache memories in support of storage operations. Memory modules 135a-n may include memory components, such as such as static RAM (SRAM), dynamic RAM (DRAM), NAND Flash memory, suitable for supporting high-speed memory operations and may combine both persistent, non-volatile memory and volatile memory. As with the system memory 110, the memory modules 135a-n may utilize a form factor corresponding to a memory card socket, such as a DIMM (Dual In-line Memory Module).

As illustrated, IHS 100 includes a remote access controller (RAC) 155 that provides capabilities for remote monitoring and management of various aspects of the operation of IHS 100. In support of these monitoring and management functions, remote access controller 155 may utilize both in-band and sideband (i.e., out-of-band) communications with various internal components of IHS 100. Remote access controller 155 may additionally implement a variety of management capabilities. In some instances, remote access controller 155 operate from a different power plane from the processors 105, storage drives 140a-n and other components of IHS 100, thus allowing the remote access controller 155 to operate, and management tasks to proceed, while the processing cores of IHS 100 are powered off. Various BIOS functions, including launching the operating system of the IHS 100, may be implemented by the remote access controller 155. In some embodiments, the remote access controller 155 may perform various functions to verify the integrity of the IHS 100 and its hardware components prior to initialization of the IHS 100 (i.e., in a bare-metal state).

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 105 as a systems-on-a-chip.

Figure 2A:
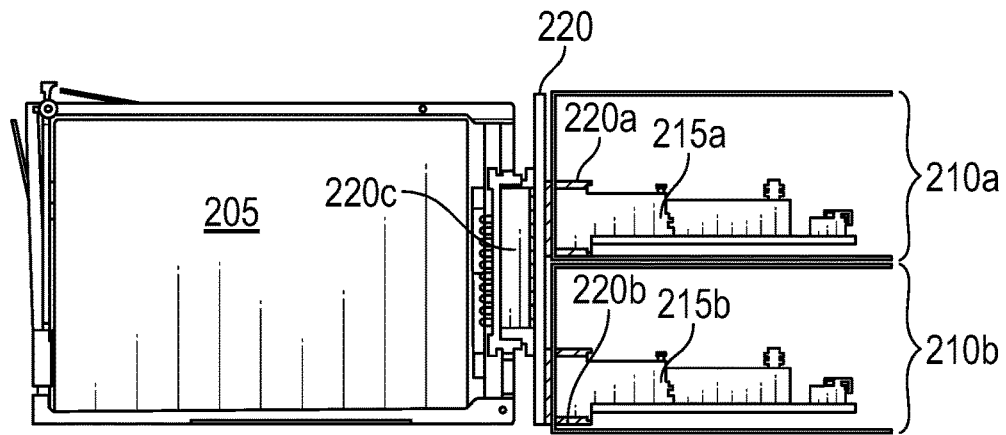
FIG. 2A is an illustration of an existing interposer configuration.

FIG. 2A is an illustration of an existing interposer configuration. As described, a rack-mounted chassis may include multiple servers. For instance, a 2RU chassis may include slots for two 1RU servers, 210a and 210b. In the cutaway illustration of FIG. 2A, a first server 210a is installed in the top slot of a chassis and a second server 210b is installed in the lower slot of the chassis. The upper server 210a is coupled to a midplane 220 of the chassis via an interposer 215a that is received by a connector 220a on the midplane 220. Similarly, the lower server 210b is coupled to the midplane 220 of the chassis via an interposer 215b that is received by another connector 220b on the midplane 220.

The midplane 220 also includes a drive bay connector 220c by which one or more replaceable components 205, such as storage drives, may be coupled to the chassis. In this manner, an upper server 210a and a lower server 210b may be coupled to a set of storage drives 205 via connectors supported by a midplane 220 of a chassis.

In the existing system of FIG. 2A, the same server may be installed in either the upper or lower slot of a chassis that utilizes the connectors on the illustrated midplane 220. For instance, the top server 210a may be removed from the top slot of the chassis and may then be installed in the lower slot of the chassis. This midplane 220 configuration promotes compatibility since the top and bottom slots of the chassis can accept the same servers. However, this configuration does include several disadvantages. As illustrated in FIG. 2A, the lower interposer connector 220b of midplane 220 is offset vertically from the drive bay connector 220c that is centrally located on the vertical height of the midplane 220. The location of the upper interposer connector 220a, however, is not vertically offset from the drive bay connector 220c of the midplane 220. It is generally infeasible to manufacture a printed circuit board, such as midplane 220, with connectors directly opposite each other on each side of the printed circuit board. Accordingly, the number of drive bay connectors, such as connector 220c, that may be supported by a midplane 220 is limited by the need to provide horizontal spacing between some of the drive bay connectors to provide space for the upper interposer connector 220a on the other side of the printed circuit board of the midplane 220.

In addition to reducing the number of drive bay connectors 220c that may be supported, existing midplanes 220 reduce the ability to provide cooling to the upper interposer connector 220a. As illustrated, the lower interposer connector 220b is vertically offset from the drive bay connector 220c such that heated air around the lower interposer connector 220b can be ventilated, in some cases via vent holes in the midplane 220 in the area surrounding the connector 220b. In midplane 220 illustrated in FIG. 2A, ventilating heated air via such vent holes is not impeded by the narrow confines separating the midplane 200 from the drive bays 205 and by the drive bay connectors 220c that box the connector 220b in horizontally.

In some instances, a consequence of interspersing interposer connectors 220a and drive bay connectors 220c along the central horizontal axis of the midplane 220 is varying signal path lengths in the signaling pathways that connect the interposer connectors 220a to a set of drive bay connectors 220c. For instance, an interposer connector 220a that is located horizontally between a series of drive bay connectors 220c on each side has a shorter signaling pathway for communicating with the interposer connectors the are closest on each side and longer signaling pathways for communicating with the last interposer connector in the series. For high-speed signaling connections in optimized systems, such differences are generally accounted for, thus resulting in additional complexity. As described in additional detail below, embodiments support the ability to locate interposer connectors such that they are more evenly spaced between a set of drive bay connectors, thus generating less variance between the timing of these signaling pathways.

Figure 2B:
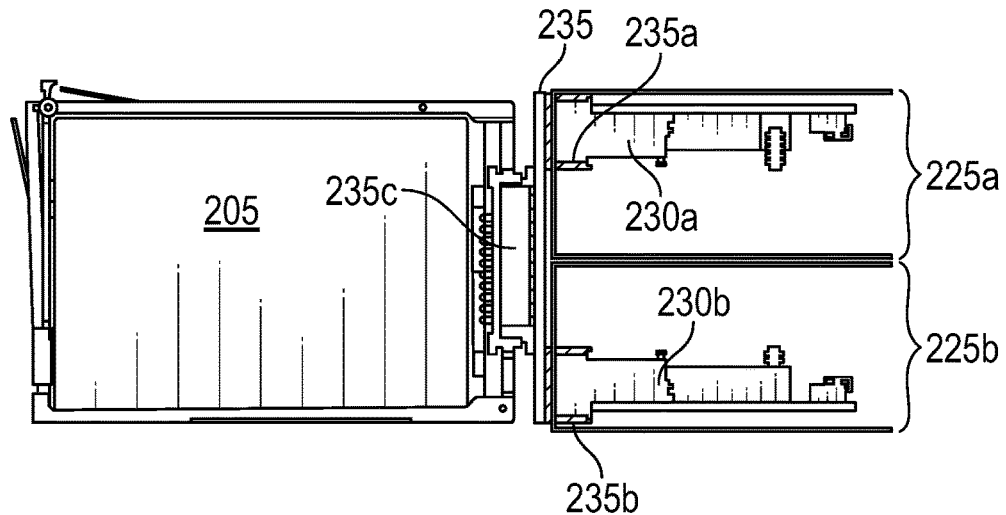
FIG. 2B is an illustration of an additional existing interposer configuration.

FIG. 2B is an illustration of an additional existing interposer configuration. In the existing system of FIG. 2B, a chassis similarly includes a top slot and a lower slot in which servers may be installed. An interposer 230a of the top server 225a is coupled to the midplane 235 of the chassis via a top interposer connector 235a of the midplane 235. Similarly, an interposer 230b of the bottom server 225b is coupled to the midplane 235 of the chassis via a bottom interposer connector 235b of the midplane 235. As before, via these couplings to the midplane 235 of the chassis, the top server 225a and the bottom server 225b may be coupled to one or more replaceable components 205, such as storage drives, that are coupled to one or more drive bay connectors 235c of the midplane 235. As illustrated, the existing midplane 235 of FIG. 2B utilizes a top interposer connector 235a and a bottom interposer connector 253b that are both vertically offset from the drive bay connectors 235c of the midplane 235. As a result, these interposers 230a, 230b may be better cooled, more consistent signal timing can be supported and the density of drive bay connectors 235c is not affected by the need to provide space for interposer connectors along the central portion of the midplane 235.

However, in order to utilize the configuration of FIG. 2B while still supporting the same server in both the top and bottom slots of the chassis requires installing the top server 225a upside down within the top slot of the chassis and inverting the top interposer connector 235a to account for the upside down orientation of top server 225a. Orienting the top server 225a in this manner poses several problems. First, administrators must manually flip a server upside down before installing the server in the top slot of a chassis and must manually flip the server with its top side facing up upon removing the server from the chassis. Such flipping of a server may be difficult to accomplish safely for some administrators in light of the considerable weight and size of a rack-mounted server. In addition, by reversing the orientation of the top server within the top slot, all of the connectors and labeling that are exposed on the rear of the top server are both upside down and backwards. This can pose significant difficulty for administrators since the notions of the left and right side of the server, and thus the numbering and ordering of rear-facing connectors, is reversed and all labels are upside down to an administrator facing the rear of the chassis.

Figure 2C:
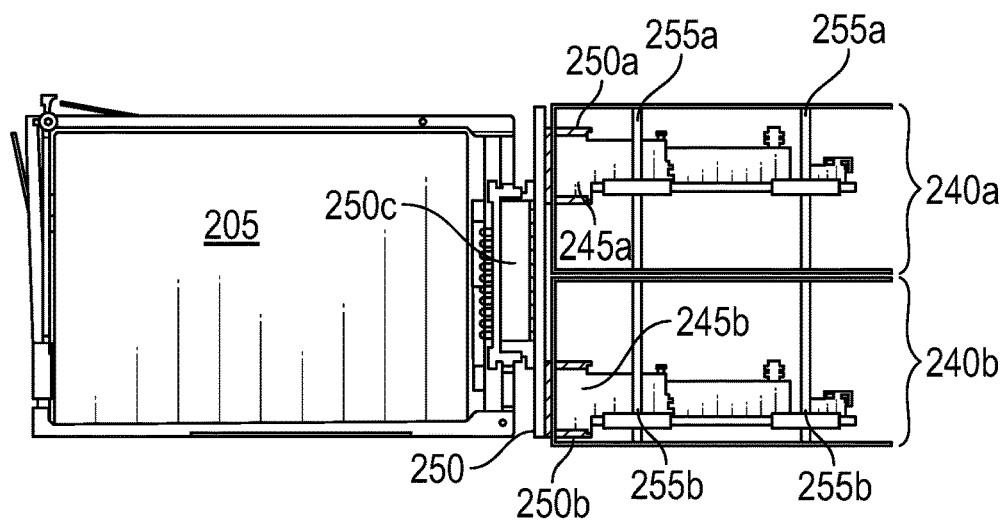
FIG. 2C is an illustration of two positions supported by a floating interposer according to embodiments, where the floating interposer couples an IHS to a chassis.

FIG. 2C is an illustration of two positions supported by a floating interposer according to embodiments, where the floating interposer is used to couple two 1RU IHSs to a 2RU chassis. In FIG. 2C, a first server IHS 240a is installed within the top slot a of chassis and a second server IHS 240b is installed within the bottom slot of the chassis. As illustrated, the top IHS 240a is coupled to an upper connector 250c of the chassis midplane 250 via a floating interposer 245a. Similarly, the bottom IHS 240b is also coupled to a lower connector 250b of the chassis midplane 250 using a floating interposer 245b that functions of same manner as the floating interposer 245a of top server 240a. Via these couplings to the midplane 250 of the chassis, the top server 240a and the bottom server 240b may be coupled to one or more replaceable components 205, such as storage drives, that are coupled to one or more drive bay connectors 250c of the midplane 250.

As described in additional detail, the floating interposers 245a and 245b are guided to their respective positions illustrated in FIG. 2C as the server IHSs 240a, 240b are inserted in their respective slots of the chassis. In the bottom IHS 240b, floating interposer 245b is guided to the level of the lower interposer connector 250b of the midplane 250. As IHS 240b is pushed into position in the lower slot, a chassis according to embodiments may guide the floating interposer 245b vertically along the guideposts 255b provided within an interposer compartment of IHS 240b. The guideposts 255b provide a single degree of freedom of movement by which floating interposer 245b may be raised or lowered from a resting position to the level of the connector 245b of the lower slot.

As described in additional detail below, the upper slot of a chassis may include guides that raise the floating interposer 245a of IHS 240a as it is inserted in the upper slot. Such guides within the upper slot of the chassis serve to raise the floating interposer 245a along the guideposts 255a provided within an interposer compartment of IHS 240a. Embodiments thus support the use of interposer connectors 250a-b that are vertically offset from the drive bay connectors 250c of the midplane 250, thus promoting airflow cooling, supporting consistent signal timing, and avoiding restrictions on the density of drive bay connectors 250c that may be supported by midplane 250. In addition, embodiments support the ability for the same IHS to be inserted in either the bottom or upper slot of the chassis. Moreover, embodiments provide this capability without the administrative burden resulting from installing the top IHS upside down, as in the existing system of FIG. 2B.

Figure 3A:
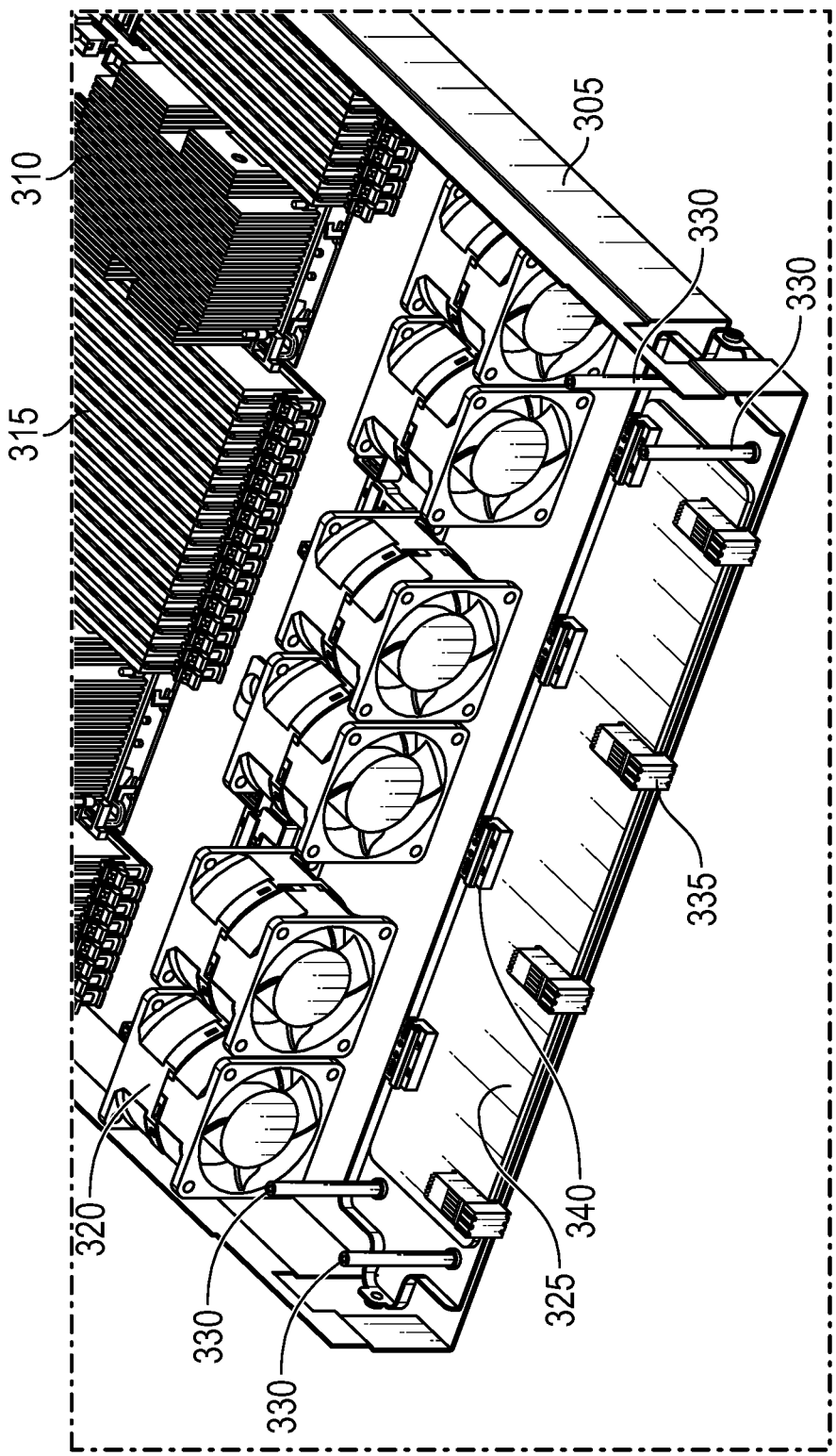
FIG. 3A is an illustration of a floating interposer according to embodiments, where the floating interposer is in a lower position.
Figure 3B:
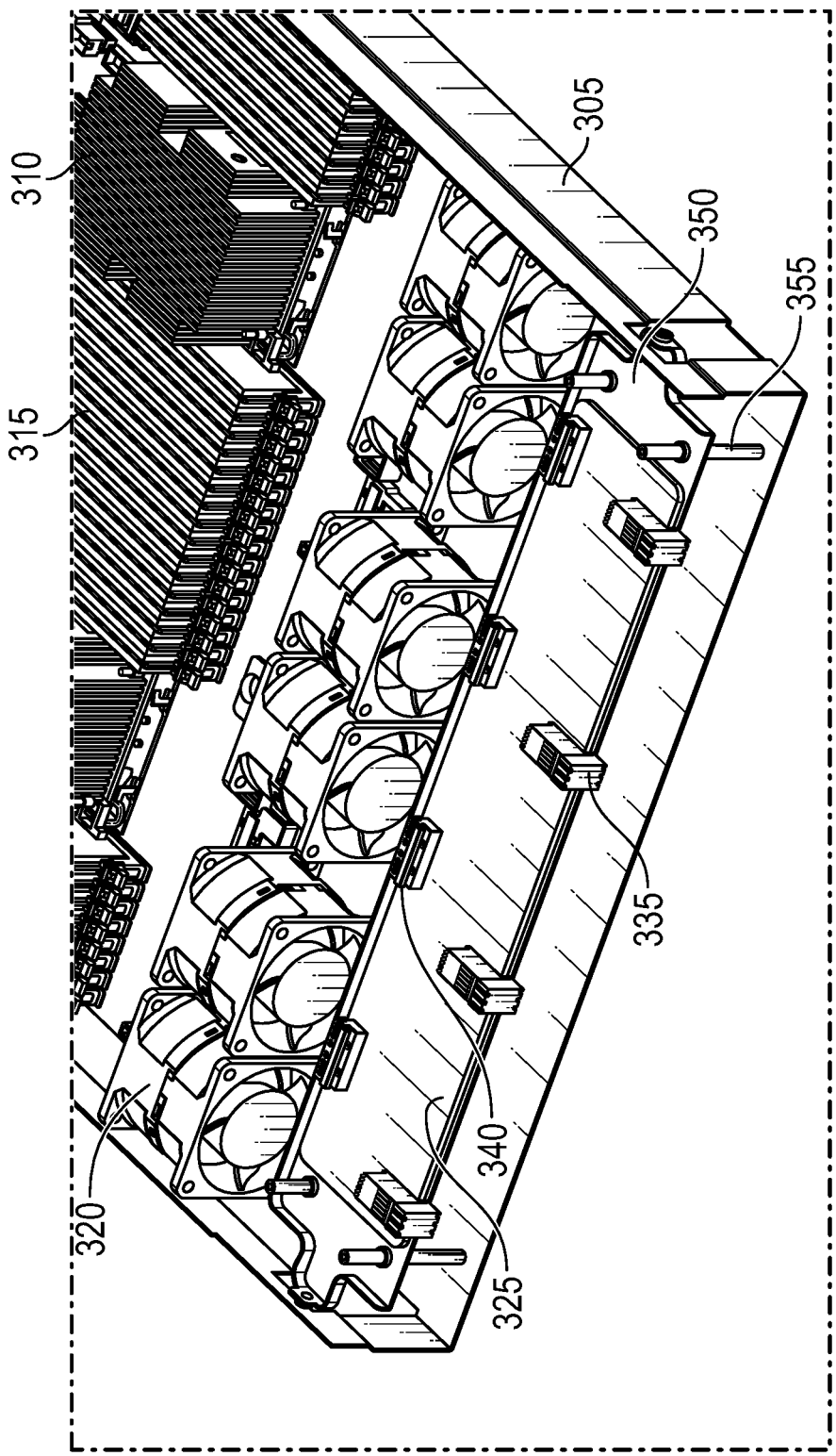
FIG. 3B is an illustration of a floating interposer according to embodiments, where the floating interposer is in an upper position.

FIG. 3A is an illustration of a floating interposer 325 according to embodiments, where the floating interposer is in a lower position. In the embodiment of FIG. 3A, a server IHS 305 is housed within a metal enclosure. The IHS 305 includes an inner compartment that includes one or more processors 310 that may be shrouded by a heat sink, such as illustrated in FIGS. 3A, 3B. The inner compartment of the IHS 305 may also include memory modules 315 and various other components. The inner compartment of the IHS 305 may be separated from a front compartment by a bank of fans 320 that ventilate heated air from within the compartments of the IHS. As illustrated, the front compartment of the IHS 305 houses a floating interposer 325 that may travel vertically along guideposts 330 located on the left and right sides of the front compartment. The illustrated embodiment utilized two cylindrical guideposts 330 on each side of the floating interposer 325, but other embodiments may utilize different numbers and geometries of guideposts in the same manner as the illustrated guideposts 330.

The floating interposer 325 may include a printed circuit board that provides connectors 335 for coupling the IHS 305 to a chassis. As described, in some embodiments, the IHS of FIGS. 3A, 3B may be a 1RU server that may be received within a slot of a 2RU chassis. In such embodiments, upon inserting the IHS within the slot of a chassis, the front facing connectors 335 of the floating interposer 325 may be coupled to corresponding connectors provided by a midplane of the chassis. As described, in a midplane of a chassis according to embodiments, connectors for receiving the floating interposer connectors 335 are provided near the top of the top slot of the chassis and near the bottom of the bottom slot of the chassis. Using this midplane configuration, the connectors of the midplane for receiving the floating interposer connectors 335 are vertically offset from the drive bay connectors or other connectors that are centrally located along the horizontal axis of the midplane. As such, the interposer connectors of the top slot are above the central portion of the midplane and the interposer connectors of the bottom slot are below the central portion of the midplane.

In the configuration illustrated in FIG. 3A, the floating midplane 325 is in a lower position whereby the interposer connector 335 is aligned vertically with the midplane connector located near the bottom of the bottom slot of a chassis. In this configuration of the floating interposer 325, the floating interposer connectors 335 are mated with the backplane connectors provided in the lower slot, thus coupling the IHS 305 to the midplane of a chassis. As illustrated, the back edge of floating interposer 325 also includes connectors 340 that receive cable connections that extend to components within the inner compartment of IHS 305. As described in additional detail below, guides provided along the side walls of the bottom slot of a chassis route the floating interposer 325 to the illustrated configuration suitable for coupling the IHS 305 to the connectors provided in the bottom slot of a chassis according to embodiments.

When the same IHS 305 is inserted in the upper slot of a chassis according to embodiments, guides provided along the sidewalls of the upper slot serve to raise the floating interposer 325 to the position illustrated in FIG. 3B. In the upper slot configuration of FIG. 3B, the floating interposer 325 has been raised along the length of guideposts 330 until the floating interposer connectors 335 are aligned vertically with the midplane connectors located near the top of upper slot of the chassis. When the floating interposer 325 has been raised to the upper slot configuration illustrated in FIG. 3B, the cables coupled to connectors 340 remain connected, with sufficient slack provided in such cables to support the upward and downward movement of the floating midplane 325.

Figure 3C:
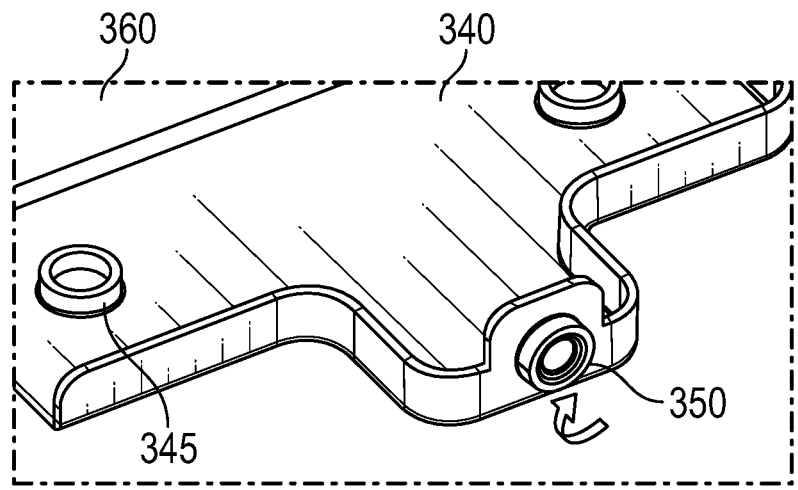
FIG. 3C is an illustration of a guidewheel portion of a floating interposer according to embodiments.

As illustrated in both FIGS. 3A and 3B and illustrated in additional detail in the close-up illustration of FIG. 3C, each end of the floating interposer 325 includes a guidewheel 350 that protrudes from openings 355 on each side of enclosure of the IHS 305. As described in additional detail below, this protruding guide wheel 350 of the floating interposer 325 is received by guide rails located along the sidewalls of chassis. Such guide rails within the lower slot are designed to guide the floating midplane 325 to the lower position illustrated in FIG. 3A and guide rails within the upper slot are designed to guide the floating midplane 325 to the upper position illustrated in FIG. 3B. As illustrated in FIG. 3C, the floating interposer may include a printed circuit board 360 that is mounted on a tray 340. The tray 340 includes guide holes 345 that are received by the guideposts 330 within the front compartment of the IHS 305. Other embodiments may utilize different numbers and/or geometries of guideposts and guide holes. The movement of the floating midplane 325 between the upper and lower slot configurations is restricted to a single degree of freedom along a vertical axis by the guideposts 330 and the guide holes 345. This maintains the proper horizontal alignment of the floating interposer 325 with the connectors provided by the midplane of the chassis while still allowing the floating interposer 325 to be repositioned vertically.

Figure 4A:
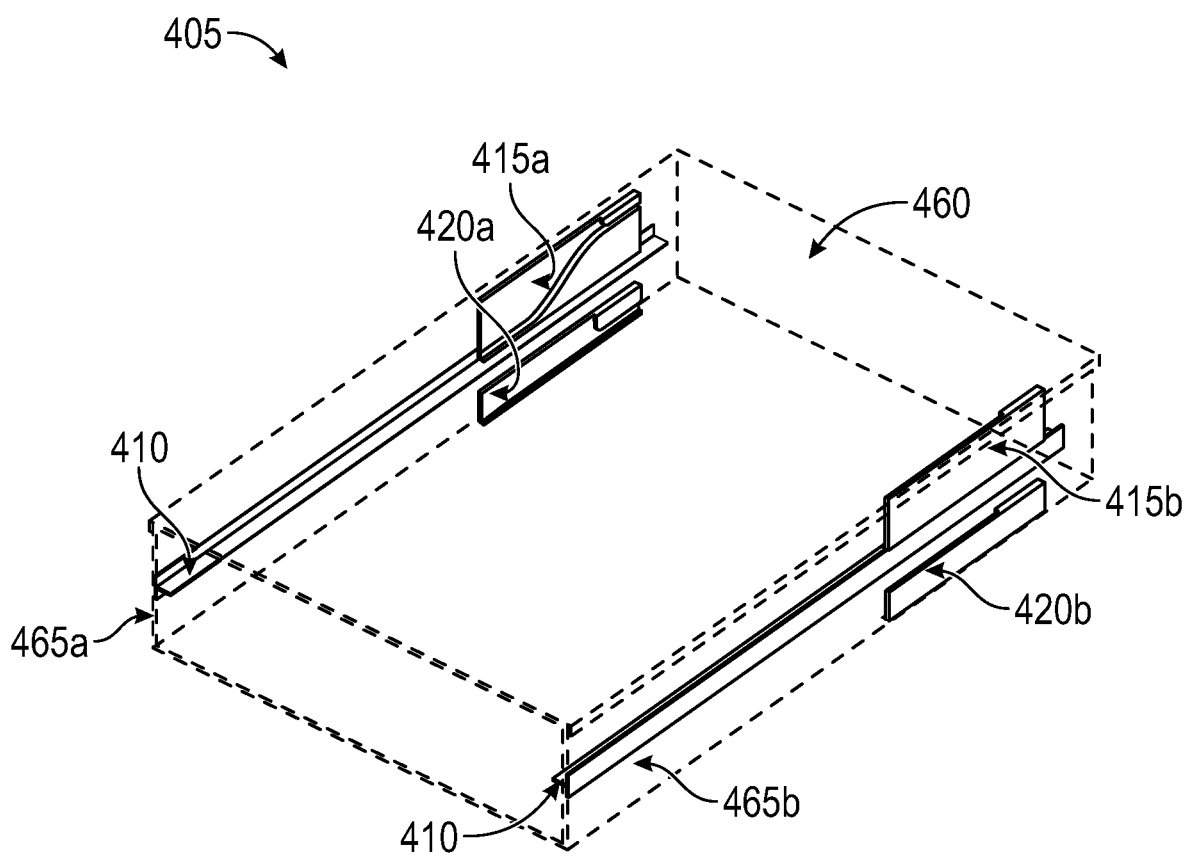
FIG. 4A is an illustration of a chassis configured according to embodiments with upper and lower guides for respectively routing a floating interposer to upper and lower connections of the chassis.

FIG. 4A is an illustration of a portion of a chassis 405 configured according to embodiments with upper and lower guides for respectively routing a floating interposer to upper and lower connections on a midplane 460 of the chassis. The illustrated rack-mounted chassis 405 of FIG. 4A includes an upper slot and a lower slot, with each slot being capable of accepting an IHS, such as a 1RU server. As described, IHSs are inserted into the slots via the back of chassis 405 and are pushed towards the midplane 460 of the chassis. The IHS in the lower slot rests on the lower base of the chassis 405 and the IHS in the upper slot rests on a set of rails 410 that extend along the left side wall 465a and the right side wall 465b of the chassis.

As illustrated, the sidewalls 465a-b of chassis 405 include guides 415a-b, 420a-b near the midplane 460 of the chassis. As the IHSs are inserted into the upper and lower slots of the chassis, the guides 415a-b, 420a-b serve to route the floating interposer of the IHS to the appropriate height for the slot in which the IHS is being installed. FIG. 4C illustrates a guide 420a according to some embodiments for use in the lower slot of chassis 405 along its left side wall 465a. The lower guide 420a of FIG. 4C includes a rail 430 that receives the protruding guide wheel, 350 in FIGS. 3A-B, of the floating interposer of the IHS inserted into the lower slot of chassis 405. As the IHS is inserted in the lower slot, the rail 430 of the lower guide 420a raises the guide wheel, and thus the floating interposer, to the level of the midplane 460 connector provided within the lower slot of chassis 405. Other guide embodiments may similarly lower a floating midplane from an upper resting position upon insertion into the lower slot. As illustrated in FIG. 2C, this midplane 250 connector 250b for receiving the interposer connector 245b within the lower slot is located near the bottom of the lower slot, and thus vertically offset from the drive bay connectors 250c of the midplane 250. As illustrated in FIG. 4C, the lower guide includes a slotted portion 435 in which the protruding guide wheel of the floating interposer is maintained within a channel 440 that restricts the vertical movement of the guide wheel. This vertical alignment provided by the slotted portion 435 of the lower guide 420a serves to align the connectors of the floating interposer with the connectors provided in the lower slot on the midplane 460.

Figure 4B:
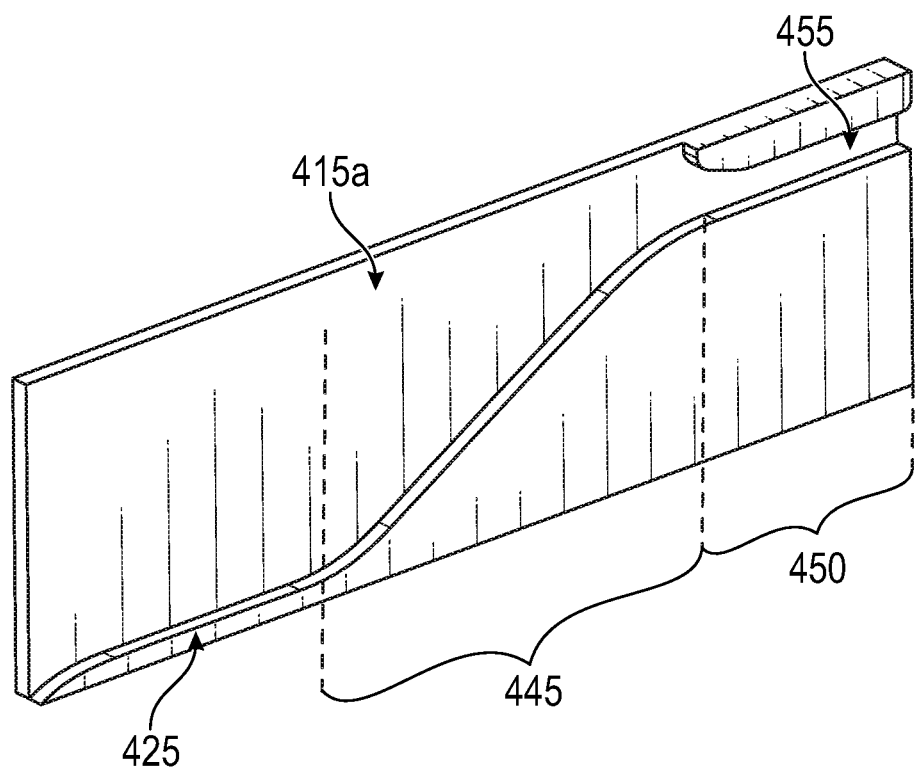
FIG. 4B is an illustration of an upper floating interposer guide according to embodiments.
Figure 4C:
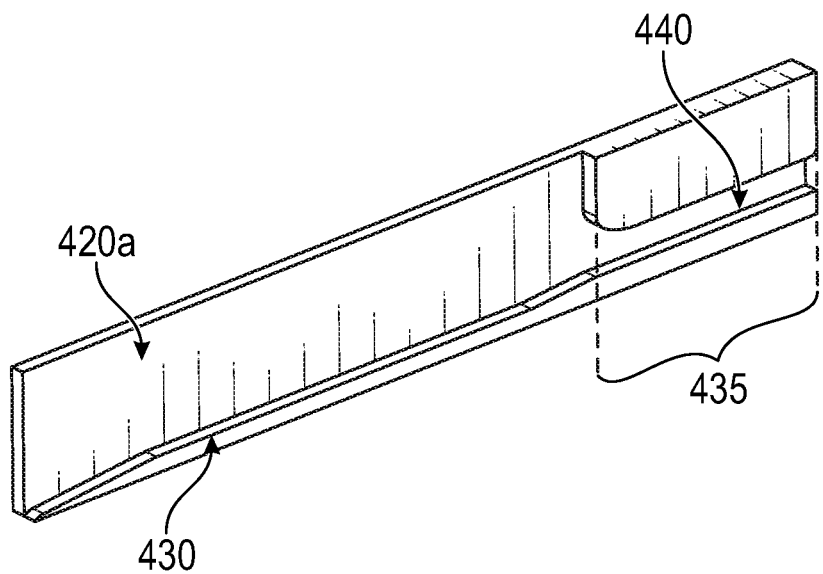
FIG. 4C is an illustration of lower floating interposer guide according to embodiments.

FIG. 4B illustrates a guide 415a according to some embodiments for use in the upper slot of chassis 405 along its left side wall 465a. The upper guide 415a of FIG. 4B also includes a rail 425 that receives the protruding guide wheel of the floating interposer of the IHS when it is inserted into the upper slot of chassis 405. As the IHS is inserted in the upper slot, the rail 425 of the upper guide 415a raises the guide wheel, and thus the floating interposer, to the level of the midplane 460 connector provided within the upper slot of chassis 405. As illustrated in FIG. 2C, this midplane 250 connector 250a for receiving the interposer connector 245b within the upper slot is located near the top of the upper slot, and thus vertically offset from the drive bay connectors 250c of the midplane 250.

As illustrated in FIG. 4B, the upper guide 415a includes a ramped portion 445 that raises the guide wheel of the floating interposer to the level of a channel 455 provided in the slotted portion 450 of the upper guide. The ramped portion 445 of the upper guide 415a serves to raise the floating interposer of an IHS inserted in the upper slot of chassis 405 to the level of the midplane 460 connector near the top of the upper slot of chassis 405. The slotted portion 450 restrict vertical travel of the protruding guide wheel and serves to align the connectors of the floating interposer with the connectors provided in the upper slot on the midplane 460. In some embodiments, the upper and lower guides 415a-b, 420a-b may be removable plates formed from plastic or metal that may be fastened to the sidewalls 465a-b of the chassis 405. In other embodiments, the upper and lower guides 415a-b, 420a-b may be integrated in the chassis 405 as permanent structures of the sidewalls 415a-b, 420a-b.

Figure 5:
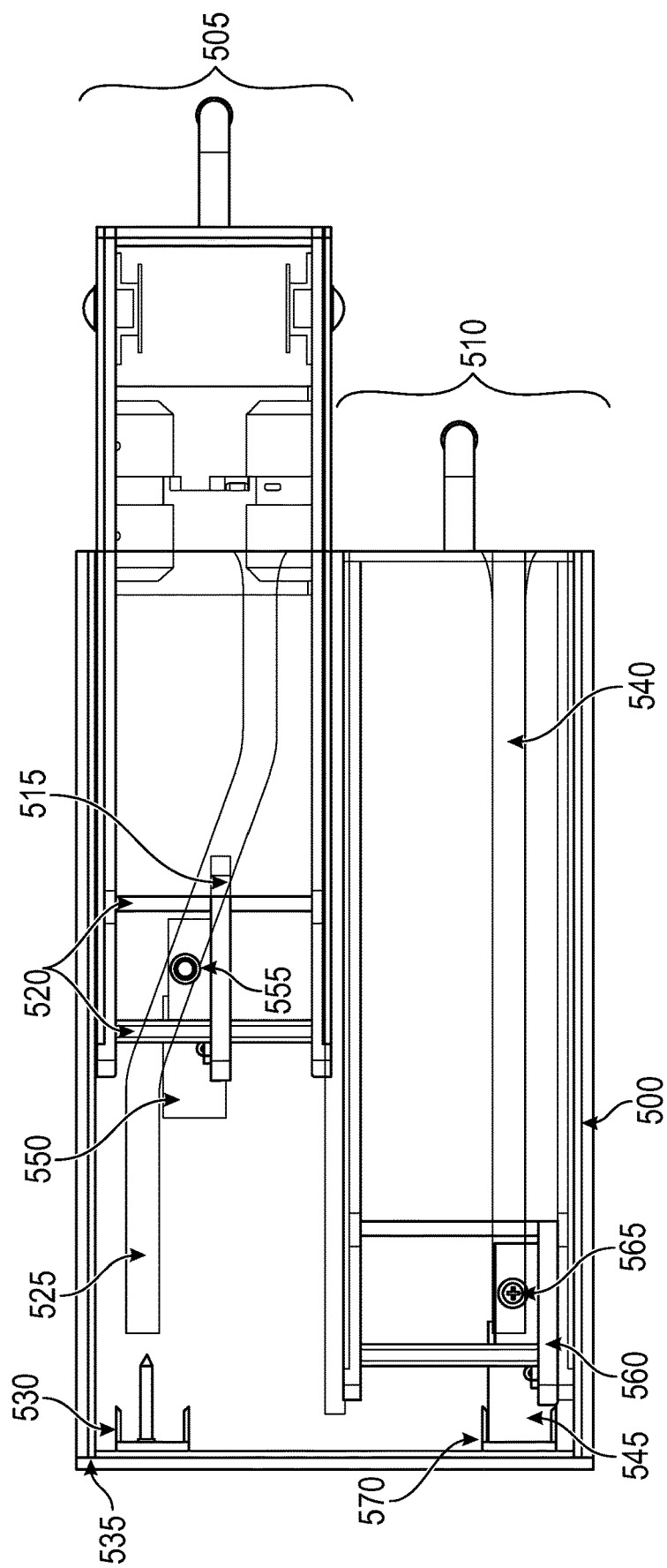
FIG. 5 is an illustration of a system according to embodiments, where the system includes a chassis that includes guides for routing floating interposers used by two IHSs installed within upper and lower slots provided the chassis.

FIG. 5 is an illustration of a system according to embodiments, where the system includes a chassis that includes guides for routing floating interposers used by two IHSs installed within upper and lower slots provided the chassis. In the embodiment of FIG. 5, an IHS is inserted within a lower slot 510 of a chassis 500, such as a 2RU chassis that includes two 1RU slots. As illustrated, the floating interposer 560 of the IHS in the lower slot 510 is positioned such that interposer connector 545 is coupled with lower connector 570 of midplane 535. As described, such vertical alignment of the floating interposer 560 is achieved by guiding the vertical movement of the protruding guide wheel 565 of the IHS. In the embodiment of FIG. 5, the guide wheel 565 is aligned vertically using a lower guide that is a channel 540 that extends the length of the lower slot 510 and receives the protruding guide wheel 565 of the floating interposer 560 when the IHS is inserted in the lower slot 510. The channel 540 may be a structure of a lower guide that is a replaceable plate that is fastened within the lower slot or may be an integrated structure of the sidewall of chassis 500.

As illustrated, an IHS is partially inserted into the upper slot 505 of chassis 500. In this partially inserted position, the floating interposer 515 has been partially raised by the guide wheel 555 of the floating interposer 515 being routed within channel 525 of the guide provided along the wall of the upper slot 505 of chassis 500. In the embodiment of FIG. 5, the channel 525 of the upper guide extends the length of the upper slot. As illustrated with regard to FIG. 4A-C, in some embodiments the upper and lower guides may extend for only a portion of the length of the slots of a chassis. The channel 525 of the upper guide includes a lower portion that receives the guide wheel 555 when the floating interposer 515 is in a resting position. The channel 525 of the upper guide also includes a ramped portion that raises the guide wheel 555, and thus the floating interposer 515, to a top portion of the channel 525 that vertically aligns a connector 550 of the floating interposer with a corresponding connector 530 of midplane 535. In this manner, the floating interposer 515 is repositioned as an administrator inserts the IHS into the upper slot 505 of the chassis 500. As described, an IHS may include columns 520 that allow the floating interposer 515 to travel vertically along the length of these columns 520, thus allowing the floating interposer to be positioned for use within an upper slot or lower slot of chassis 500.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis housing a first Information Handling System (IHS), the chassis comprising:
    a lower slot comprising a plurality of lower connectors for receiving a floating interposer of the first IHS;
    a lower guide that routes the floating interposer of the first IHS to the lower connectors as the first IHS is inserted in the lower slot;
    an upper slot comprising a plurality of upper connectors for receiving the floating interposer of the first IHS; and
    an upper guide that routes the floating interposer of the first IHS to the upper connectors as the first IHS is inserted in the upper slot, wherein the upper guide comprises a rail that routes a guidewheel of the floating interposer, and wherein the floating interposer travels vertically along guidepost to a vertical location of the upper connectors of the chassis as the first IHS is inserted in the upper slot.

2. The chassis of claim 1, wherein the lower connectors and upper connectors couple the floating interposer of the first IHS to a midplane of the chassis.

3. The chassis of claim 2, wherein the midplane comprises connectors for coupling a plurality of storage devices to the chassis.

4. The chassis of claim 1, wherein the lower guide comprises a rail that routes a guidewheel of the floating interposer to a vertical location of the lower connectors of the chassis as the first IHS is inserted in the lower slot.

5. The chassis of claim 1, wherein the floating interposer is raised along a plurality of guideposts by the routing of the guide wheel by the rail of the upper guide.

6. The chassis of claim 4, wherein the lower guide comprises a channel that receives the guidewheel and aligns the floating interposer with the lower connectors.

7. The chassis of claim 1, wherein the upper guide comprises a channel that receives the guidewheel and aligns the floating interposer with the upper connectors.

8. An Information Handling System (IHS) comprising:
    one or more processors and a memory device coupled to the one or more processors; and
    a floating interposer for coupling the IHS to a chassis, wherein the floating interposer comprises a plurality of connectors received by the upper and lower connectors of the chassis and further comprises a plurality of guidewheels that protrude from an enclosure of the IHS, and wherein a vertical position of the floating interposer is aligned with a plurality of lower connectors of the chassis when the IHS is inserted in the lower slot of the chassis and wherein the wherein the vertical position of the floating interposer is aligned with a plurality of upper connectors of the chassis when the IHS is inserted in the upper slot of the chassis, and wherein the plurality of protruding guidewheels are received by rails comprised within the upper and lower slots of the chassis, and wherein the floating interposer travels vertically along guideposts to the upper connectors as the IHS is inserted in the upper slot and vertically along the guideposts to the lower connectors as the IHS is inserted in the lower slot.

9. The IHS of claim 8, wherein the upper and lower connectors are located on a midplane of the chassis.

10. The IHS of claim 9, wherein the midplane comprises connectors for coupling a plurality of storage devices to the chassis.

11. The IHS of claim 8, wherein vertical movement of the guidewheels moves the floating interposer vertically.

12. The IHS of claim 8, further comprising:
the plurality of guideposts that extend from the base of an enclosure of the IHS and limit movement of the floating interposer along a vertical axis.

13. A method for modifying information processing capabilities provided by a chassis capable of hosting a plurality of IHSs (Information Handling Systems), the method comprising:
inserting a first IHS within a lower slot of the chassis, wherein the insertion of the first IHS in the lower slot aligns a floating interposer of the first IHS with a plurality of lower connectors of a midplane of the chassis; and
inserting the first IHS within an upper slot of the chassis, wherein the insertion of the first IHS in the upper slot aligns the floating interposer of the first IHS with a plurality of upper connectors of the midplane of the chassis, and wherein the floating interposer is aligned with the plurality of upper connectors by a plurality of rails along sidewalls of the chassis within the upper slot, and wherein the floating interposer is guided vertically along a set of guideposts of the first IHS when inserted in the upper slot and when inserted in the lower slot, and wherein each rail routes a guidewheel of the floating interposer such that the floating interposer travels vertically along guideposts to a vertical location of the upper connectors as the IHS is inserted in the upper slot and to a vertical location of the lower connectors as the IHS is inserted in the lower slot.

14. The method of claim 13, wherein the floating interposer is aligned with the plurality of lower connectors by a plurality of guides along sidewalls of the chassis within the lower slot.

* * * * *

UNITED STATES PATENT AND TRADEMARK OFFICE
CERTIFICATE OF CORRECTION

| | |
|---|---|
| PATENT NO. | : 11,099,613 B1 |
| APPLICATION NO. | : 16/925791 |
| DATED | : August 24, 2021 |
| INVENTOR(S) | : Chen et al. |

Page 1 of 1

It is certified that error appears in the above-identified patent and that said Letters Patent is hereby corrected as shown below:

In the Claims

In Column 14, Line 41, Claim 1, delete "vertically along guidepost" and insert -- vertically along a plurality of guideposts -- therefor.

In Column 14, Line 55, Claim 5, delete "is raised along a plurality of guideposts" and insert -- is raised along the plurality of guideposts -- therefor.

In Column 15, Line 7, Claim 8, delete "and wherein the wherein the vertical" and insert -- and wherein the vertical -- therefor.

Signed and Sealed this
Nineteenth Day of October, 2021

Drew Hirshfeld
*Performing the Functions and Duties of the
Under Secretary of Commerce for Intellectual Property and
Director of the United States Patent and Trademark Office*